US012727280B2

(12) United States Patent
Wang et al.

(10) Patent No.: US 12,727,280 B2
(45) Date of Patent: Sep. 1, 2026

(54) SOLAR CELL SHEET AND SOLAR CELL PANEL

(71) Applicant: LONGI SOLAR TECHNOLOGY (TAIZHOU) CO., LTD., Taizhou (CN)

(72) Inventors: Binyuan Wang, Taizhou (CN); Suoyuan Kong, Taizhou (CN); Xiaobo Tao, Taizhou (CN); Honglei Shen, Taizhou (CN)

(73) Assignee: LONGI SOLAR TECHNOLOGY (TAIZHOU) CO., LTD., Taizhou (CN)

( * ) Notice: Subject to any disclaimer, the term of this patent is extended or adjusted under 35 U.S.C. 154(b) by 0 days.

(21) Appl. No.: 19/223,111

(22) Filed: May 30, 2025

(65) Prior Publication Data

US 2025/0294914 A1 Sep. 18, 2025

Related U.S. Application Data

(63) Continuation of application No. 18/901,063, filed on Sep. 30, 2024, now Pat. No. 12,349,503, which is a continuation-in-part of application No. 17/606,012, filed as application No. PCT/CN2020/094408 on Jun. 4, 2020, now abandoned.

(30) Foreign Application Priority Data

Jun. 14, 2019 (CN) ........................ 201920898401.1

(51) Int. Cl.
*H10F 77/20* (2025.01)
*H10F 19/90* (2025.01)
*H10F 77/00* (2025.01)

(52) U.S. Cl.
CPC ......... *H10F 77/215* (2025.01); *H10F 19/902* (2025.01); *H10F 19/904* (2025.01); *H10F 77/20* (2025.01); *H10F 77/937* (2025.01)

(58) Field of Classification Search
CPC .... H10F 77/215; H10F 19/902; H10F 19/904; H10F 77/20; H10F 77/937
See application file for complete search history.

(56) References Cited

U.S. PATENT DOCUMENTS

2010/0018562 A1* 1/2010 Kurahashi ............ H10F 19/904 136/244
2018/0212072 A1* 7/2018 Hosokawa ............ H10F 77/215

* cited by examiner

*Primary Examiner* — Michael Y Sun
(74) *Attorney, Agent, or Firm* — Bayramoglu Law Offices LLC

(57) ABSTRACT

A solar cell includes: a first surface, a second surface, a first side surface and a second side surface; wherein first electrode strips are provided on the first surface, and second electrode strips are provided on the second surface; the first electrode strips include first discontinuous electrodes, each including at least two first electrode segments, and the second electrode strips include second discontinuous electrodes, each including at least two second electrode segments; and the first electrode segments include a first end electrode segment adjacent to the first side surface, the second electrode segments include a second end electrode segment adjacent to the first side surface, and a length of the first end electrode segment is different from a length of the second end electrode segment.

13 Claims, 9 Drawing Sheets

SOLAR CELL SHEET AND SOLAR CELL PANEL

CROSS REFERENCE TO THE RELATED APPLICATIONS

The present application is a Continuous application (CA) of U.S. application Ser. No. 18/901,063, which is a Continuous In Part application (CIP) of U.S. application Ser. No. 17/606,012, which is the national phase entry of International Application No. PCT/CN2020/094408, filed on Jun. 4, 2020, which is based upon and claims the priority of Chinese Patent Application No. 201920898401.1, filed on Jun. 14, 2019, which is incorporated herein in its entirety by reference.

TECHNICAL FIELD

The present application relates to the technical field of solar-energy photovoltaics, and particularly relates to a solar cell and a solar cell panel.

BACKGROUND

With the development of the technique of photovoltaics, crystalline-silicon solar cells have been extensively utilized as an environment-friendly and renewable energy source.

Currently, the electrodes are fabricated by printing silver slurry, aluminum slurry etc. on the front and back faces of a solar cell. Generally, the electrodes on the light facing face (the face directly irradiated by the sunlight) of the solar cell are referred to as the front electrodes, and the electrodes on the shadow face (the face not directly irradiated by the sunlight) of the solar cell are referred to as the back electrodes. When the solar cells are connected by series welding, the photovoltaic solder strip connects the front electrodes of one solar cell to the back electrodes of another solar cell.

Referring to FIG. 1, FIG. 1 shows a schematic diagram of a solar cell in the prior art. As shown in FIG. 1, the starting point E/F of the front electrodes 10 on the solar cell and the starting point G/H of the back electrodes 20 have different distances from the edge of the solar cell. Because the front electrodes affect the light receiving area and the convergence efficiency of the solar cell, it is generally configured that the distance from the starting point of the front electrodes in the length direction to the edge of the solar cell is smaller, and the distance from the starting point of the back electrodes in the length direction to the edge of the solar cell is larger.

However, when the solar cells are connected by series welding, because the distances from the starting points of the front electrodes and of the back electrodes to the edge of the cell are different, in the welding between the solar cell and the photovoltaic solder strip, the stresses generated at the starting point of the front electrodes and at the starting point of the back electrodes cannot offset with each other in the positive and negative directions, whereby hidden cracking is generated at the starting welding spot between the solar cells and the photovoltaic solder strip, which affects the efficiency of the assembling of the solar cells.

SUMMARY

In view of the above disadvantages of the prior art, the present application solves the problem of hidden cracking at the starting welding spot between the solar cells and the photovoltaic solder strip. The present application provides a solar cell, a solar cell panel and a screen printing plate.

In order to solve the above technical problem, the present application provides a solar cell including: a first surface and a second surface arranged opposite each other along a thickness direction of the solar cell; and a first side surface and a second side surface arranged opposite each other along a first direction, and the first surface is a light receiving surface;

- wherein a plurality of first electrode strips extending along the first direction and arranged at intervals along a second direction are provided on the first surface, a plurality of second electrode strips extending along the first direction and arranged at intervals along the second direction are provided on the second surface, and the plurality of first electrode strips are provided to vertically correspond one-to-one with the plurality of second electrode strips in the thickness direction of the solar cell; wherein the first direction intersects with the second direction, and the thickness direction of the solar cell is perpendicular to the first direction and the second direction;
- projections of endpoints in the first direction, of the first electrode strip and the second electrode strip that are provided to vertically correspond one-to-one with each other, overlaps along the thickness direction of the solar cell;
- the plurality of first electrode strips include first discontinuous electrodes, and each first discontinuous electrode includes at least two first electrode segments arranged at intervals along the first direction and extending along the first direction; and the plurality of second electrode strips include second discontinuous electrodes, and each second discontinuous electrode includes at least two second electrode segments arranged at intervals along the first direction and extending along the first direction;
- the at least two first electrode segments include a first end electrode segment adjacent to the first side surface, the at least two second electrode segments include a second end electrode segment adjacent to the first side surface, and a length of the first end electrode segment along the first direction is less than a length of the second end electrode segment along the first direction; and
- the at least two first electrode segments further include a third end electrode segment adjacent to the second side, the at least two second electrode segments further include a fourth end electrode segment adjacent to the second side, and a length of the third end electrode segment along the first direction is less than a length of the fourth end electrode segment along the first direction.

In the second aspect, the present application further discloses a solar cell panel, wherein the solar cell panel is formed by the solar cell stated above.

The present application has the following advantages:

- in the embodiments of the present application, because the projection of the starting point of the front-electrode strip in the first direction and the projection of the starting point of the back-electrode strip in the first direction coincide, when the solar cells are connected by series welding by using a photovoltaic solder strip, the welding stresses generated at the starting point of the front-electrode strip and at the starting point of the back-electrode strip can offset with each other in the positive and negative directions, which prevents hidden cracking at the starting welding spot between the solar cells and the photovoltaic solder strip, thereby increasing the efficiency of the assembling of the solar cells. In addition, lengths of the two end electrode segments of the electrode strips on a light receiving surface and a back surface are different, which reduces stress on front and back surfaces and reduces pressure on a surface of the solar cell during lamination. Direct pressure bearing surfaces have longer end grid segments to prevent hidden cracks The above description is merely a summary of the technical solutions of the present application. In order to more clearly know the elements of the present application to enable the implementation according to the contents of the description, and in order to make one of the above and other purposes, features and advantages of the present application more apparent and understandable, particular embodiments of the present application will be provided below.

BRIEF DESCRIPTION OF THE DRAWINGS

In order to more clearly illustrate the technical solutions of the embodiments of the present application or the prior art, the figures that are required to describe the embodiments or the prior art will be briefly introduced below. Apparently, the figures that are described below are embodiments of the present application, and a person skilled in the art can obtain other figures according to these figures without paying creative work.

DETAILED DESCRIPTION

Figure 1:
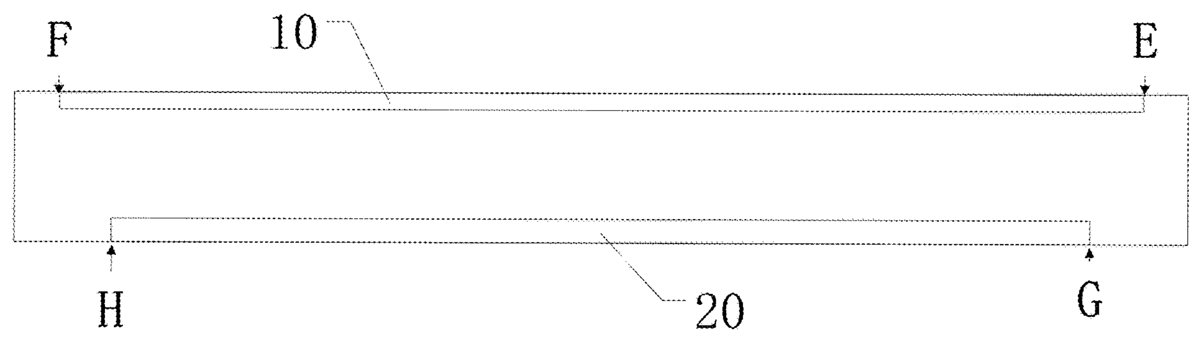
FIG. 1 is a schematic diagram of a solar cell in the prior art.

In order to further illustrate the embodiments, drawings are provided in the present application. Those drawings are part of the disclosure of the present application, and they are mainly used to illustrate the embodiments, and may explain the operation principle of the embodiments in cooperation with the relevant description of the description. By referring to those contents, a person skilled in the art can comprehend other feasible embodiments and the advantages of the present application. The elements in the drawings are not drawn to scale, and similar reference numbers generally denote similar elements.

The present application will be described further with reference to the drawings and the particular embodiments.

The embodiments of the present application provide a solar cell, wherein the solar cell comprises a light facing face and a shadow face, the light facing face is provided with a plurality of front electrodes, and the shadow face is provided with a plurality of back electrodes; the plurality of front electrodes are arranged separately in a length direction to form a front-electrode strip; the plurality of back electrodes are arranged separately in the length direction to form a back-electrode strip; a center line of the front-electrode strip in the length direction is a first center line; a center line of the back-electrode strip in the length direction is a second center line; a projection of the first center line in a first direction and a projection of the second center line in the first direction coincide, wherein the first direction refers to a direction from the light facing face to the shadow face; and a projection of a starting point of the front-electrode strip in the first direction and a projection of a starting point of the back-electrode strip in the first direction coincide.

In the embodiments of the present application, because the projection of the starting point of the front-electrode strip in the first direction and the projection of the starting point of the back-electrode strip in the first direction coincide, when the solar cells are connected by series welding by using a photovoltaic solder strip, the welding stresses generated at the starting point of the front-electrode strip and at the starting point of the back-electrode strip can offset with each other in the positive and negative directions, which prevents hidden cracking at the starting welding spot between the solar cells and the photovoltaic solder strip, thereby effectively increasing the efficiency of the assembling of the solar cells.

Figure 2:
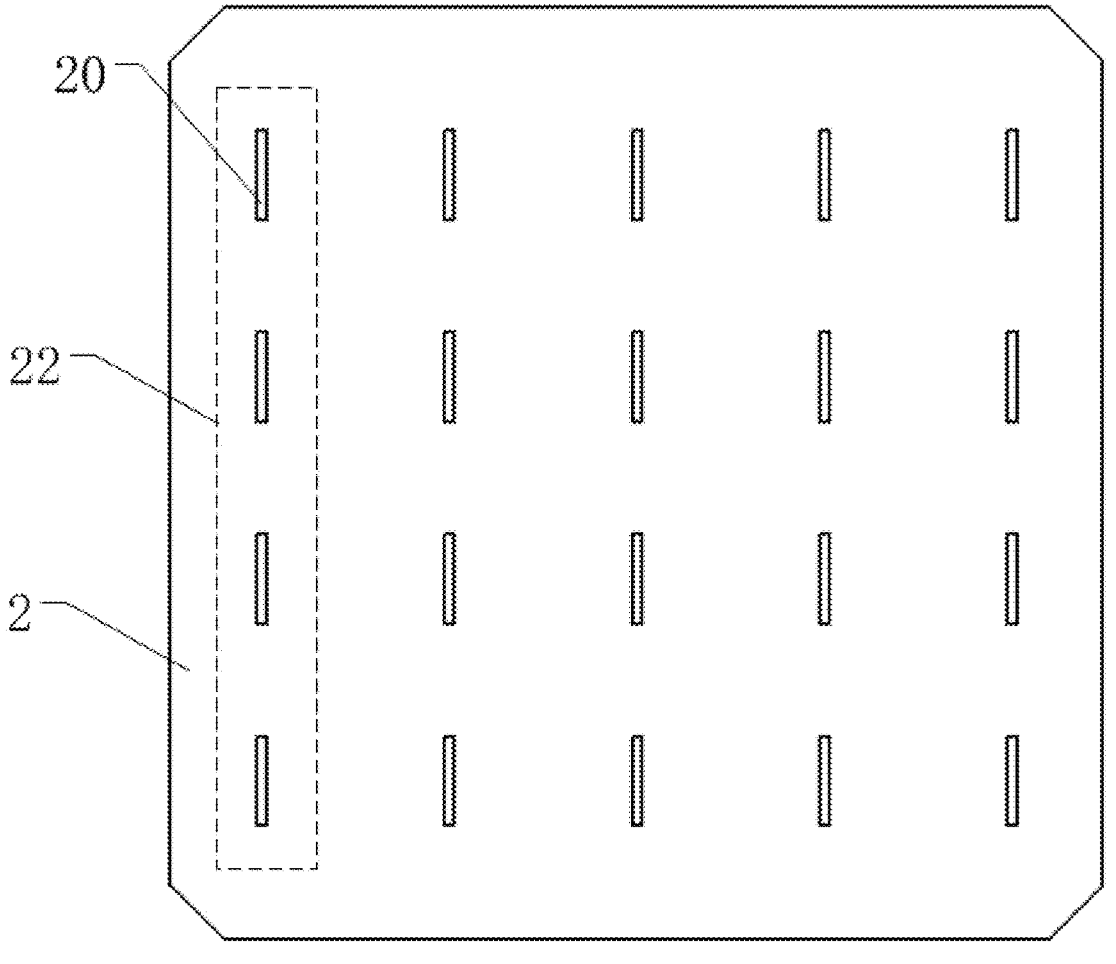
FIG. 2 is a schematic diagram of the back electrodes of a solar cell according to the present application.
Figure 3:
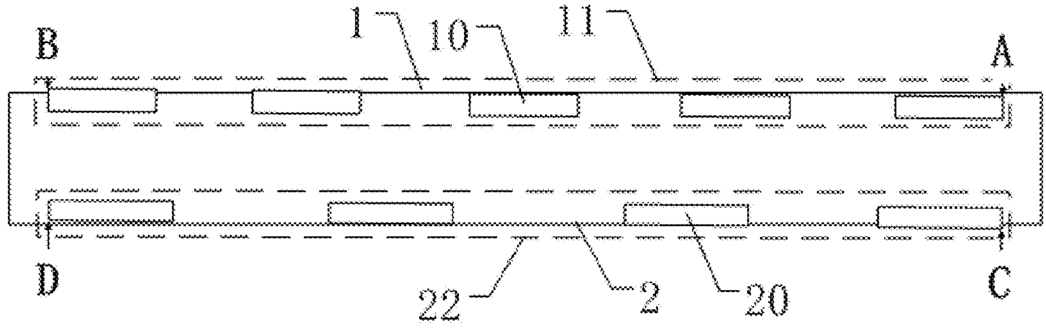
FIG. 3 is a schematic diagram of the solar cell in the other direction according to the present application.

Referring to FIG. 2, FIG. 2 shows a schematic diagram of the back electrodes of the solar cell according to an embodiment of the present application. Referring to FIG. 3, FIG. 3 shows a schematic diagram of the solar cell in the other direction according to an embodiment of the present application. As shown in the drawings, the solar cell comprises a light facing face 1 and a shadow face 2, the light facing face 1 is provided with a plurality of front electrodes 10, and the shadow face 2 is provided with a plurality of back electrodes 20; the plurality of front electrodes 10 are arranged separately in the length direction to form a front-electrode strip 11; the plurality of back electrodes 20 are arranged separately in the length direction to form a back-electrode strip 22; the center line of the front-electrode strip 11 in the length direction is a first center line; the center line of the back-electrode strip 22 in the length direction is a second center line; the projection of the first center line in the first direction and the projection of the second center line in the first direction coincide, wherein the first direction refers to the direction from the light facing face 1 to the shadow face 2; and the projection of the starting point A/B of the front-electrode strip 11 in the first direction and the projection of the starting point C/D of the back-electrode strip 22 in the first direction coincide.

In the embodiments of the present application, when the solar cells are connected by series welding by using a photovoltaic solder strip, the welding stresses generated at the starting point A/B of the front-electrode strip 11 and at the starting point C/D of the back-electrode strip can offset with each other in the positive and negative directions, which prevents hidden cracking at the starting welding spot between the solar cells and the photovoltaic solder strip, thereby effectively increasing the efficiency of the assembling of the solar cells.

In practical applications, the starting point of the front-electrode strip 11 may be set to be any one of the point A or the point B. It can be understood that, if the point A is set to be the starting point of the front-electrode strip 11, then certainly the point B is the tailing point of the front-electrode strip. In the same manner, the above-described rule of defining the starting point also applies to the starting point C/D of the back-electrode strip 22.

In practical applications, because the solar cells are connected by series welding by using a photovoltaic solder strip, assuming that the photovoltaic solder strip is welded from the point A of the front-electrode strip 11 as the starting point, then when the photovoltaic solder strip and the back-electrode strip 22 are being welded, the welding may be performed from the point D as the starting point. The starting points of the front-electrode strip and the back-electrode strip, and the starting points of the welding between the front-electrode strip and the back-electrode strip and the photovoltaic solder strip, are not particularly limited in the present application.

Moreover, the first direction refers to the direction from the light facing face 1 to the shadow face 2, i.e., the direction perpendicular to the light facing face 1 and the shadow face 2, and the direction here is not limited to pointing to the shadow face 2 from the light facing face 1, and may also be the direction pointing to the light facing face 1 from the shadow face 2.

In the embodiments of the present application, in order to improve the esthetics of the solar cell and the evenness of convergence, and simplify the welding process, the spacings between the neighboring front electrodes 10 of the front-electrode strip 11 may be set to be equal or unequal, and the spacings between the neighboring back electrodes 20 of the back-electrode strip 22 may be set to be equal or unequal. Certainly, a person skilled in the art may set the spacings between the neighboring front electrodes and between the neighboring back electrodes according to practical demands, which is not particularly limited in the embodiments of the present application.

In the embodiments of the present application, the front-electrode strip 11 and the back-electrode strip 22 may be a plurality of front-electrode strips 11 and a plurality of back-electrode strips 22, which can effectively reduce the convergence distance of the solar cell, thereby increasing the convergence efficiency of the solar cell.

In practical applications, the plurality of front-electrode strips 11 are evenly distributed on the light facing face 1, and the plurality of back-electrode strips 22 are evenly distributed on the shadow face 2. That cannot only improve the uniformity of the converging current of the solar cell, but also can improve the aesthetic degree of the solar cell. Furthermore, that can also simplify the process of welding the solar cell with the photovoltaic solder strip.

Preferably, the quantity of the front electrodes 10 of the front-electrode strip 11 is greater than or equal to the quantity of the back electrodes 20 of the back-electrode strip 22.

In practical applications, in order to increase the light receiving area of the solar cell and increase the convergence efficiency of the solar cell, generally it is configured that the quantity of the front electrodes 10 of the front-electrode strip 11 is greater than the quantity of the back electrodes 20 of the back-electrode strip 22. Certainly, in order to improve the esthetics of the solar cell and the convenience of the welding of the photovoltaic solder strip, it may also be configured that the quantity of the front electrodes 10 of the front-electrode strip 11 is equal to the quantity of the back electrodes 20 of the back-electrode strip 22, which is not particularly limited in the embodiments of the present application.

Figure 4:
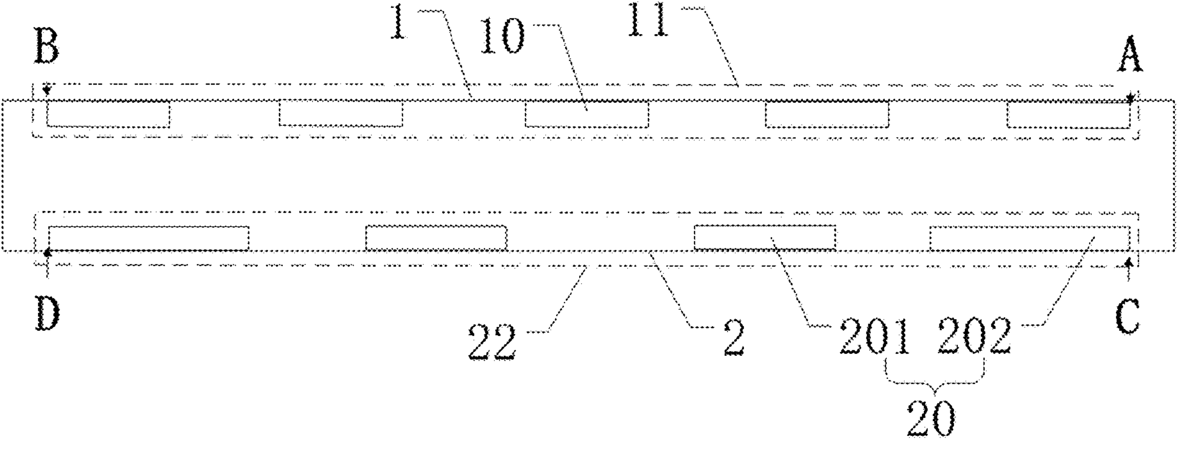
FIG. 4 is a schematic diagram of another solar cell according to the present application.

Referring to FIG. 4, FIG. 4 shows a schematic diagram of another solar cell according to an embodiment of the present application. As shown in FIG. 4, the plurality of back electrodes 20 include first back electrodes 201 and second back electrodes 202, wherein the first back electrodes 201 refer to the back electrodes adjacent to the starting point of the back-electrode strip 22, and the second back electrodes 202 refer to the back electrodes provided between the first back electrodes 201; and the lengths of the first back electrodes 201 and of the second back electrodes 202 are unequal or equal.

In the embodiments of the present application, when the lengths of the first back electrodes 201 and of the second back electrodes 202 are equal, the spacings between the plurality of back electrodes 20 of the back-electrode strip 22 may be adjusted, so that the projection of the starting point C/D of the back-electrode strip 22 in the first direction and the projection of the starting point A/B of the front-electrode strip 11 in the first direction coincide, which prevents hidden cracking at the starting welding spot between the solar cells and the photovoltaic solder strip, thereby effectively increasing the efficiency of the assembling of the solar cells.

When the lengths of the first back electrodes 201 and of the second back electrodes 202 are unequal, because the first back electrodes 201 are the back electrodes adjacent to the starting point of the back-electrode strip 22, and the second back electrodes 202 are the back electrodes provided between the first back electrodes 201, the lengths of the first back electrodes 201 may be set to be greater than the lengths of the second back electrodes 202, so that the projection of the starting point of the back-electrode strip 22 in the first direction and the projection of the starting point of the front-electrode strip 11 in the first direction coincide, which prevents hidden cracking at the starting welding spot between the solar cells and the photovoltaic solder strip, thereby effectively increasing the efficiency of the assembling of the solar cells.

Certainly, a person skilled in the art may also set that the lengths of the first back electrodes 201 are less than the lengths of the second back electrodes 202, and by adjusting the spacings between the first back electrodes 201 and the second back electrodes 202, enable the projection of the starting point of the back-electrode strip 22 in the first direction and the projection of the starting point of the front-electrode strip 11 in the first direction to coincide, which prevents hidden cracking at the starting welding spot between the solar cells and the photovoltaic solder strip, thereby effectively increasing the efficiency of the assembling of the solar cells.

In the embodiments of the present application, it is merely required to ensure that the projection of the starting point of the front-electrode strip 11 in the first direction and the projection of the starting point of the back-electrode strip 22 in the first direction coincide. Whether that is realized particularly by increasing or reducing the spacings between the back electrodes 20, or by increasing or reducing the lengths of the back electrodes 20, may be configured particularly by a person skilled in the art according to circumstances, and is not particularly limited in the embodiments of the present application.

Preferably, among the plurality of back electrodes 20, the spacings between two neighboring back electrodes 20 are equal or unequal.

In practical applications, when the consumption of the silver slurry of the front electrodes and the back electrodes is constant, that, among the plurality of back electrodes 20, the spacings between two neighboring back electrodes 20 are equal or unequal means that the spacings between two neighboring back electrodes 20 may be equally increased or reduced, or the spacings between two neighboring back electrodes 20 may be unequally increased or reduced, to realize the technical effect that the projection of the starting point of the front-electrode strip in the first direction and the projection of the starting point of the back-electrode strip in the first direction coincide, which prevents hidden cracking at the starting welding spot between the solar cells and the photovoltaic solder strip, thereby effectively increasing the efficiency of the assembling of the solar cells. Certainly, a person skilled in the art may also set the spacings between the neighboring back electrodes to be equal or unequal according to actual situations, which is not particularly limited in the embodiments of the present application.

Preferably, the width of the front electrodes 10 is less than or equal to the width of the back electrodes 20, and/or, the length of the front electrodes 10 is less than or equal to the length of the back electrodes 20.

In the embodiments of the present application, by configuring that the width of the front electrodes 10 is less than the width of the back electrodes 20, and/or, the length of the front electrodes 10 is less than the length of the back electrodes 20, the light receiving area of the solar cell is increased, thereby improving the photovoltaic conversion rate of the solar cell. In practical applications, it may also be configured that the width of the front electrodes 10 is equal to the width of the back electrodes 20, and the length of the front electrodes 10 is equal to the length of the back electrodes 20, so that the front electrodes and the back electrodes can be completely welded simultaneously by using an automatic welding tool, which simplifies the welding process, and improves the reliability of the welding. Certainly, a person skilled in the art may also set the particular lengths and widths of the front electrodes 10 and the back electrodes 20 according to practical demands, which is not particularly limited in the embodiments of the present application.

In order to better understand the present application, further embodiments are provided.

Figure 6:
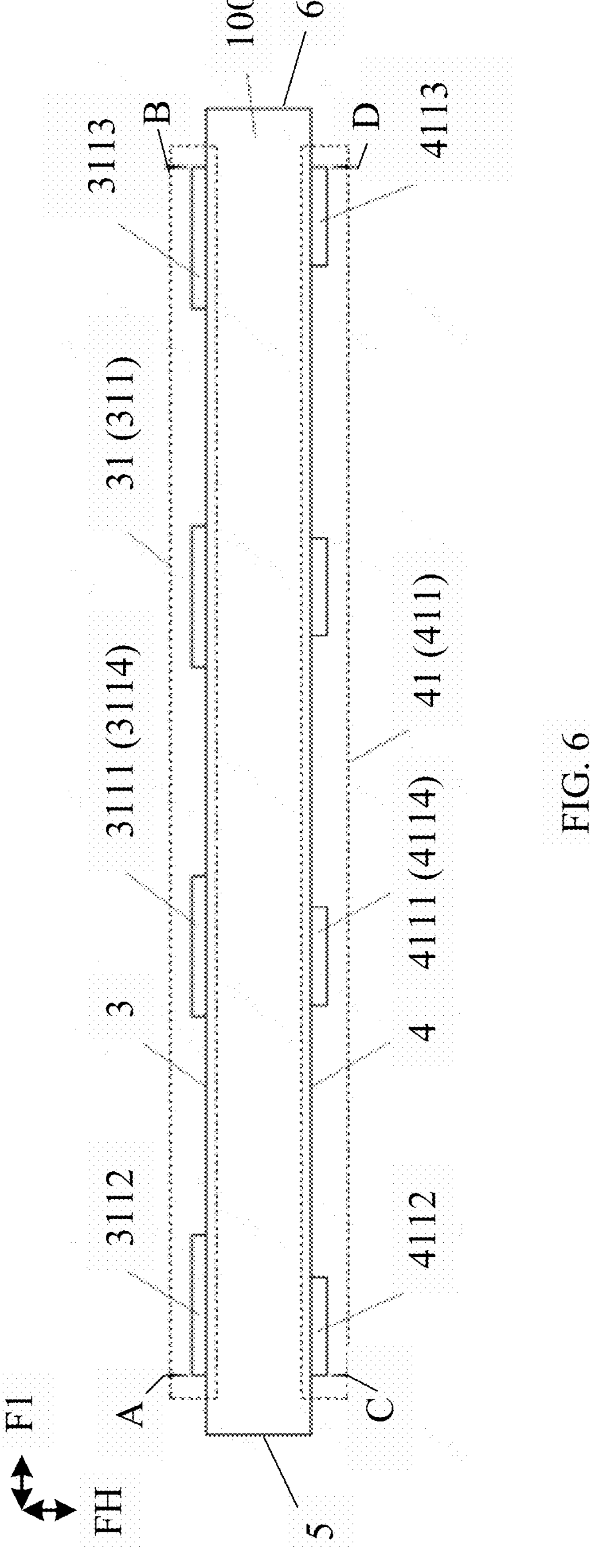
FIG. 6 is a schematic side view of another solar cell according to the present application.
Figure 7:
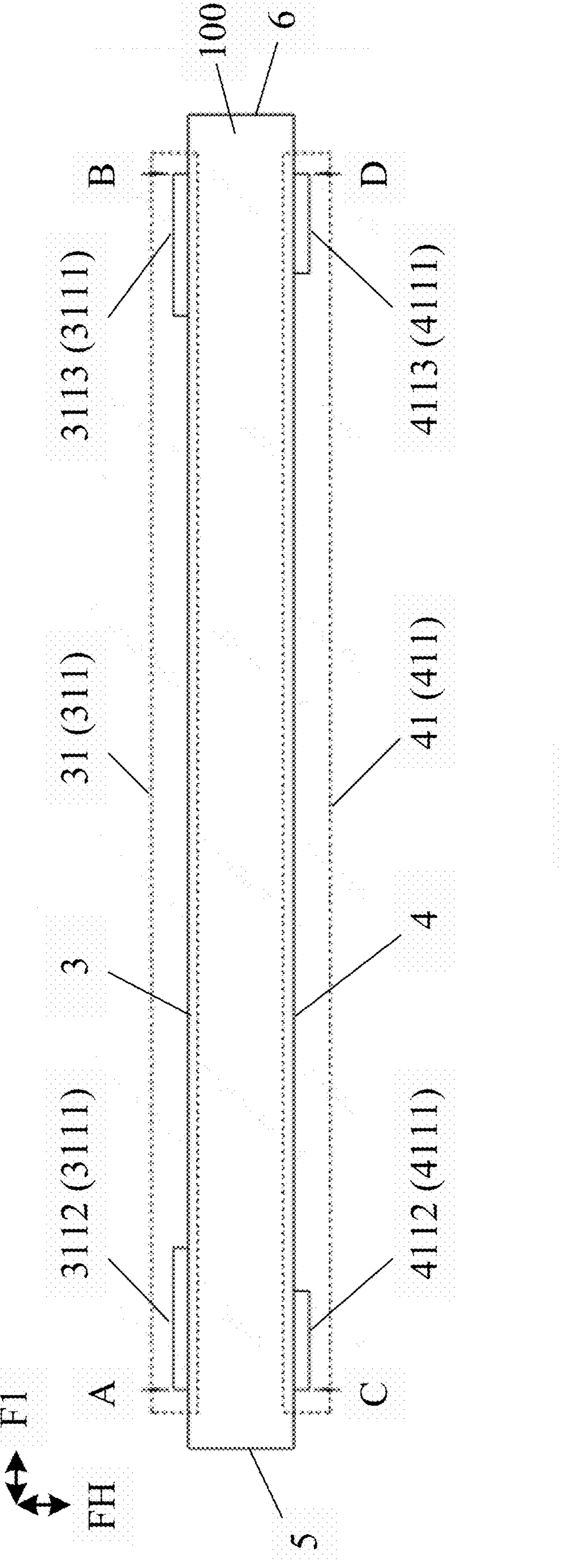
FIG. 7 is a schematic side view of still another solar cell according to the present application.
Figures 8A, 8B, 8C, 8D:
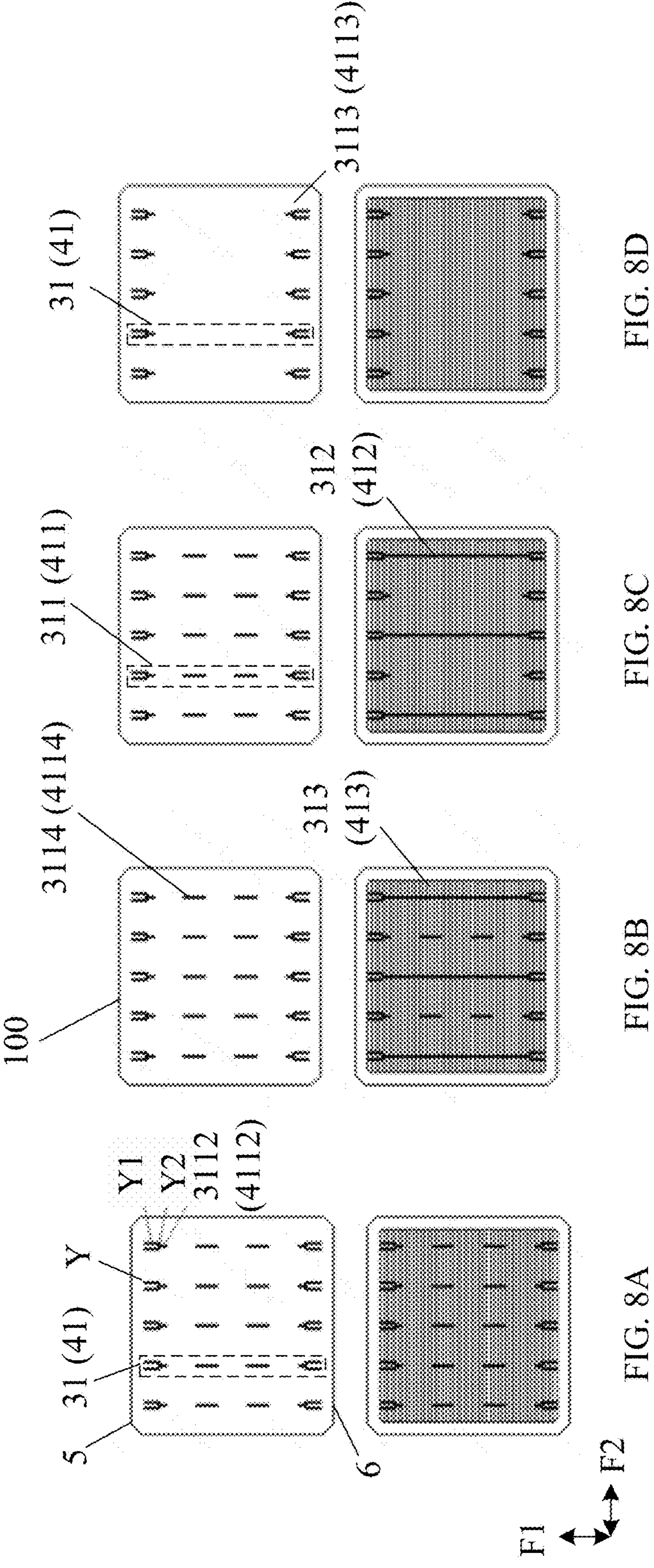
FIGS. 8A to 8D are schematic top views of the electrode strips (main grid electrodes) and fine grid electrodes of the solar cell, containing harpoon structures in the present application, respectively.
Figure 9:
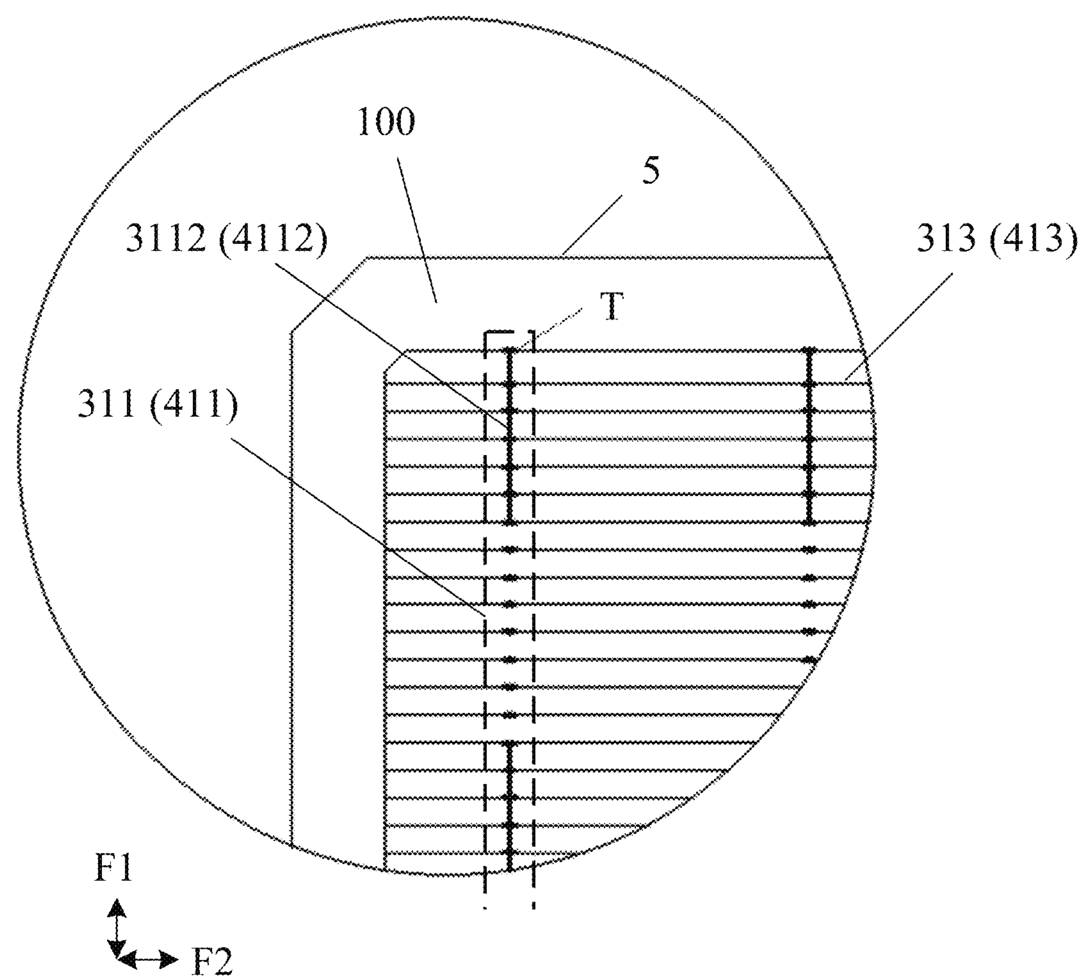
FIG. 9 is an enlarged schematic diagram of widening sections of the fine grid electrodes in the present application.
Figure 10:
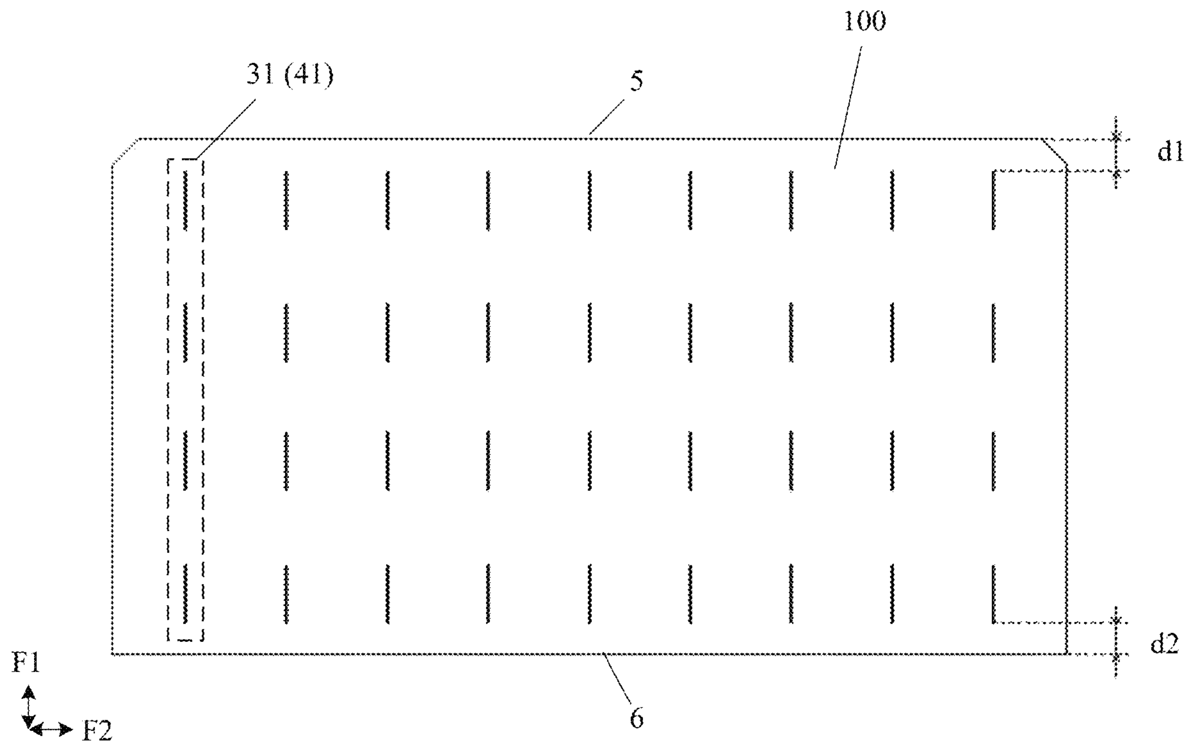
FIG. 10 is a schematic top view of a non-cutting edge and a cutting edge of the solar cell of the present application.
Figure 11:
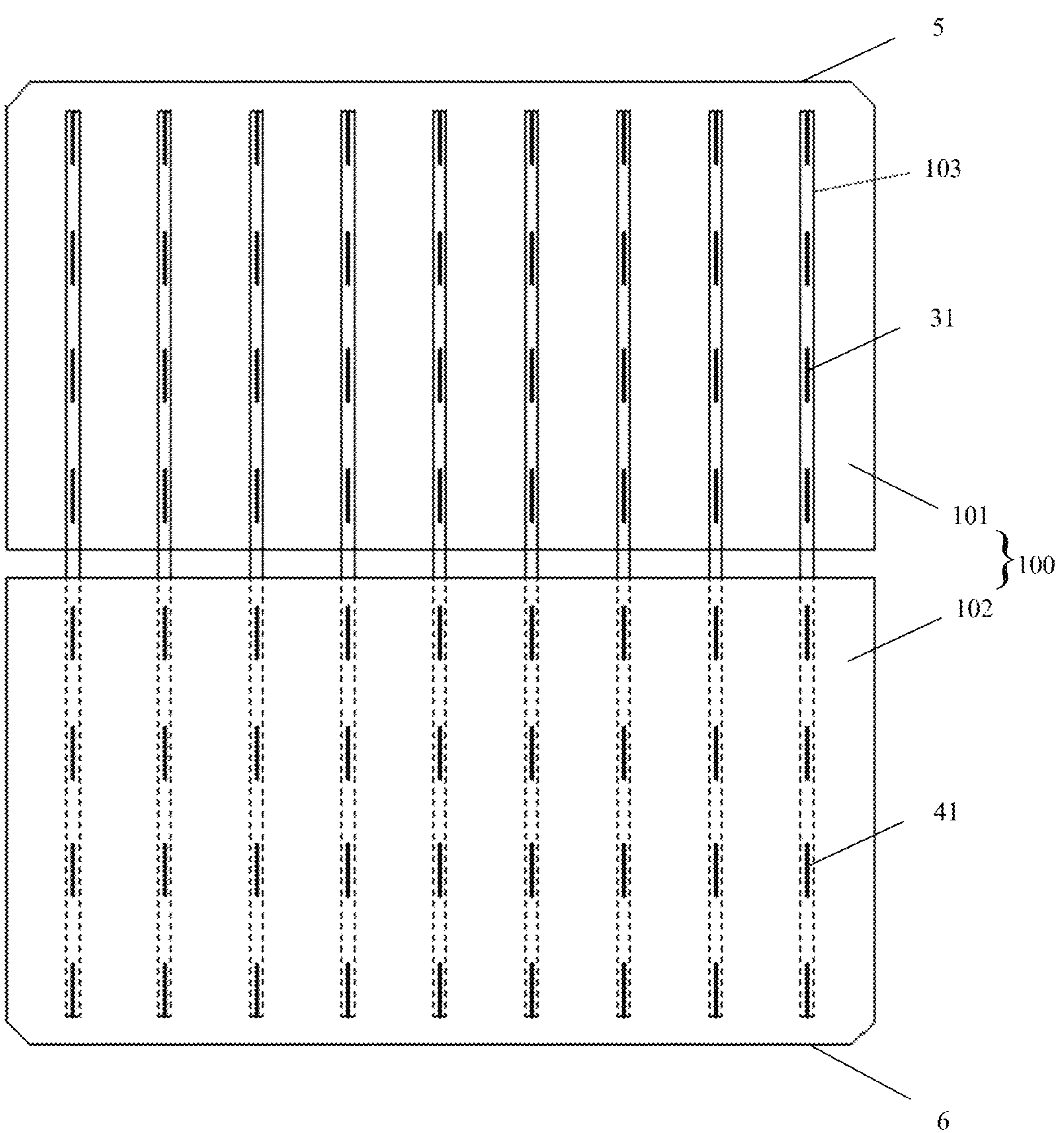
FIG. 11 is a schematic top view of a solar cell string of the present application.

FIGS. 5A to 5D are schematic top views of electrode strips (main grid electrodes) and fine grid electrodes of the solar cell of the present application, respectively. FIG. 6 is a schematic side view of another solar cell according to the present application. FIG. 7 is a schematic side view of still another solar cell according to the present application. FIGS. 8A to 8D are schematic top views of the electrode strips (main grid electrodes) and fine grid electrodes of the solar cell, containing harpoon structures in the present application, respectively. FIG. 9 is an enlarged schematic diagram of widening sections of the fine grid electrodes in the present application. FIG. 10 is a schematic top view of a non-cutting edge and a cutting edge of the solar cell of the present application. FIG. 11 is a schematic top view of a solar cell string of the present application.

Referring to FIGS. 5A to 10, a solar cell 100 according to an embodiment of the present application is shown, wherein the solar cell 100 includes: a first surface 3 and a second surface 4 arranged opposite each other along a thickness direction FH of the solar cell 100; and a first side surface 5 and a second side surface 6 arranged opposite each other along the aforementioned length direction F1.

For example, the first surface 3 here is the aforementioned light facing face (light receiving surface), and the second surface 4 is the aforementioned shadow face (back surface).

The thickness direction FH here is the aforementioned first direction of FIGS. 1 to 4. The length direction F1 here refers to the aforementioned length direction of the aforementioned front electrode strip and back electrode strip.

Among them, a plurality of first electrode strips 31 extending along the length direction F1 and arranged at intervals along the second direction F2 are provided on the first surface 3, and a plurality of second electrode strips 41 extending along the length direction F1 and arranged at intervals along the second direction F2 are provided on the second surface 4, and the plurality of first electrode strips 31 are provided to vertically correspond one-to-one with the plurality of second electrode strips 41 in the thickness direction FH of the solar cell 100.

That the plurality of first electrode strips 31 are provided to vertically correspond one-to-one with the plurality of second electrode strips 41 in the thickness direction FH of the solar cell 100 here refers to: a displacement distance between the corresponding first electrode strip 31 and second electrode strip 41 is within 1 mm in the thickness direction FH. The length direction F1 intersects with the second direction F2, and the thickness direction FH of the solar cell 100 is perpendicular to the length direction F1 and the second direction F2.

The first electrode strip 31 here is the aforementioned front electrode strip, and the second electrode strip 41 is the aforementioned back electrode strip, both of which are the main grid electrodes of the solar cell.

The second direction F2 here refers to a direction in which the aforementioned front and back electrode strips are arranged, as well as an extension direction of the fine grid electrodes of the solar cell.

The main grid electrode and the fine grid electrode here are known concepts in the art. The fine grid electrode is used to collect and initially gather current generated by the solar cell, usually intersecting or intersecting in perpendicular to the corresponding main grid electrode. The main grid electrode is used to gather the current collected by the fine grid electrode. A width of the fine grid electrode is less than or equal to that of the main grid electrode.

Among them, projections of endpoints in the first direction F1, of the first electrode strip 31 and the second electrode strip 41 that are provided to vertically correspond one-to-one with each other, overlaps along the thickness direction FH of the solar cell 100, as shown in FIGS. 5A to 8D.

Among them, the plurality of first electrode strips 31 include first discontinuous electrodes 311, and each first discontinuous electrodes 311 includes at least two first electrode segments 3111 arranged at intervals along the length direction F1 and extending along the length direction F1; the plurality of second electrode strips 41 include second discontinuous electrodes 411, and each second discontinuous electrode 411 includes at least two second electrode segments 4111 arranged at intervals along the length direction F1 and extending along the length direction F1; and the at least two first electrode segments 3111 include a first end electrode segment 3112 adjacent to the first side surface 5, the at least two second electrode segments 4111 include a second end electrode segment 4112 adjacent to the first side surface 5, and a length of the first end electrode segment 3112 along the length direction F1 is different from a length of the second end electrode segment 4112 along the length direction F1.

Figures 5A, 5B, 5C, 5D:
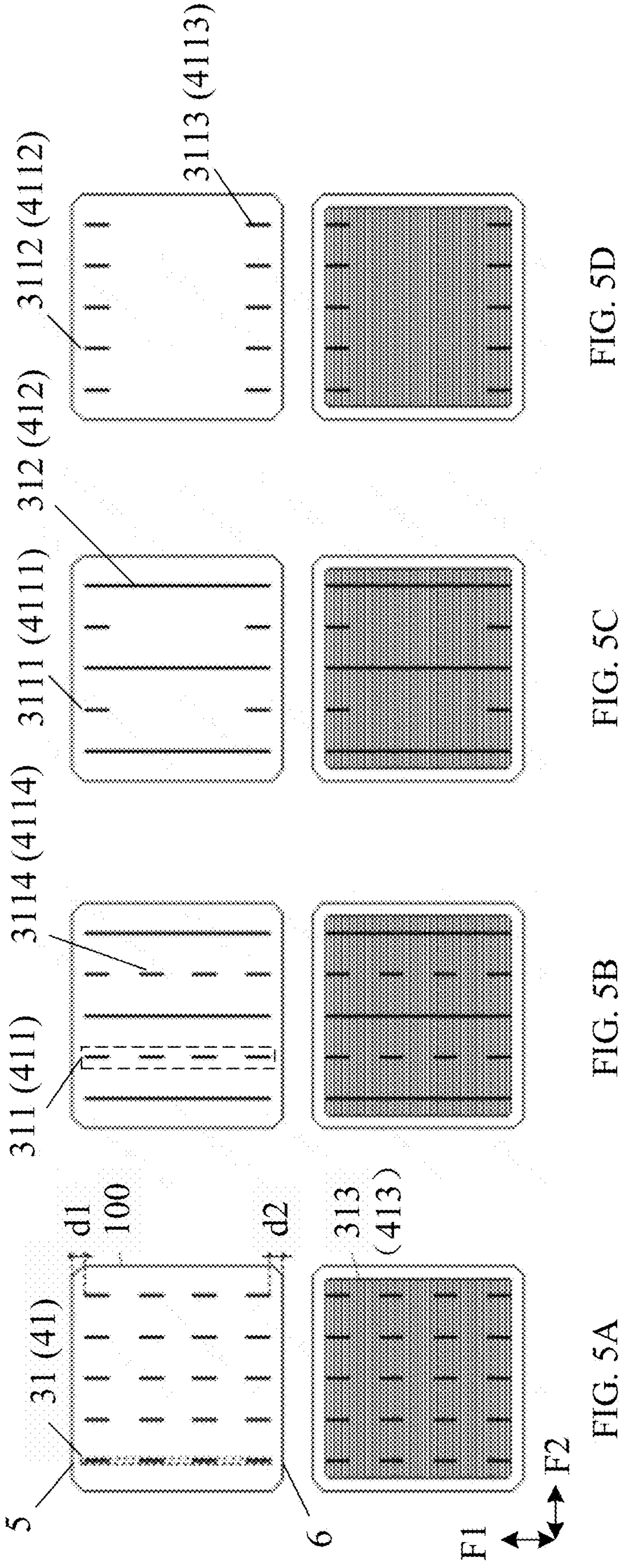
FIGS. 5A to 5D are schematic top views of electrode strips (main grid electrodes) and fine grid electrodes of the solar cell of the present application, respectively.

As shown in FIG. 5A, the first electrode strips 31 included in the solar cell 100 may all be first discontinuous electrodes 311, or the second electrode strip 41 may all be second discontinuous electrodes 411. Discontinuous electrodes may achieve reliable electrical connection and electricity collection while reducing shading area and saving electrode paste. Preferably, each electrode strip may include 2-8 electrode segments.

As shown in FIG. 5B, first continuous electrodes 312 may be provided between the first discontinuous electrodes 311 included in the solar cell 100, or second continuous electrodes 412 may be provided between the second discontinuous electrodes 411. This setting is a result of a comprehensive consideration of balancing current collection and cost savings.

As shown in FIGS. 5C to 5D, each first discontinuous electrode 311 included in the solar cell 100 may only have a first end electrode segment 3112, or each second discontinuous electrode 411 may only have a second end electrode segment 4112. The end electrode segment is necessary because during welding of an electrical connector (photovoltaic solder strip, or welding strip), ends of the electrical connector needs to be welded to the end electrode segments to protect the solar cell and balance stresses on the first surface 3 and the second surface 4.

The first surface 3 and the second surface 4 of the solar cell 100 of the present application may adopt any of the electrode arrangement patterns shown in FIGS. 5A to 5D or FIGS. 8A to 8B, respectively.

For the sake of clarity, distribution schematic diagrams of the corresponding fine grid electrodes 313 (413) are separately shown in lower figures of FIGS. 5A to 5D. In fact, upper figures of FIGS. 5A to 5D contain distributions of the fine grid electrodes 313 (413) similar to that shown in the lower figures. Numbers and spacings of the fine grid electrodes 313 (413) on the first surface 3 and the second surface 4 are preferably different. In order to avoid light shielding on the front face of the solar cell, the number of the fine grid electrodes on the first surface 3 may be smaller than that on the second surface 4.

The fine grid electrodes 313 (413) extends along the second direction, and at least a part of the fine grid electrodes 313 (413) are provided to intersect with the first electrode strips 31 or the second electrode strips 41, and are connected to the first electrode strips 31 or the second electrode strips 41 at intersection positions, so as to collect the current collected by the fine grid electrodes 313 (413) to the first electrode strips 31 or the second electrode strips 41.

In addition, the fine grid electrodes 313 (413) extend along the second direction, intersect with the first electrode strips 31 or the second electrode strips 41 or intersect with extension lines of the first electrode strips 31 or the second electrode strip 41, and solder pads or thickened fine grid electrodes, that is, widening sections of the fine grid electrodes, are set at the positions where the fine grid electrodes 313 (413) intersect with the first electrode strips 31 or the second electrode strips 41 or intersect with extension lines of the first electrode strips 31 or the second electrode strip 41, as shown in FIG. 9, which is an enlarged schematic diagram of the widening sections of the fine grid electrodes in the present application. In this way, on the one hand, it may facilitate welding between the welding strip and the solar cell 100, and avoid damaging the fine grid electrode. On the other hand, it is beneficial to directly collect the current collected by the fine grid electrodes 313 (413) to the welding strip.

The above FIGS. 5A to 5D only illustrate four electrode distribution patterns of the first electrode strips 31 on the first surface 3 or the second electrode strips 41 on the second surface 4 of the solar cell 100 of the present application. In practical applications, approximate shapes of the electrode distribution patterns of the first electrode strips 31 on the first surface 3 or the second electrode strips 41 on the second surface 4 of the solar cell 100 in the present application may be the same or different. For example, the first surface 3 may choose the electrode distribution pattern of FIG. 5A, while the second surface 4 may choose either an electrode distribution pattern similar to FIG. 5A or an electrode distribution pattern similar to FIGS. 5B to 5C. The wording "similar" mentioned here refers to, for example, there is a only difference is that a length of the electrode segments of the first discontinuous electrode 311 and the second discontinuous electrode 411 on the first surface 3 is different form a length of the electrode segments of the first discontinuous electrode 311 and the second discontinuous electrode 411 on the second surface 4, respectively, at least lengths of the end electrode segments thereof may be different. In this way, on the one hand, it increases flexibility of design to maximize material savings, and on the other hand, it reduces pressure at the end of the electrode strip of the solar cell, which carries the press during lamination.

Referring to FIGS. 6 to 7, further embodiments of the solar cell 100 of the present application are shown, wherein the length of the first end electrode segment 3112 along the length direction F1 is greater than the length of the second end electrode segment 4112 along the length direction F1.

The first surface 3 here is the aforementioned light facing face (light receiving surface), and the second surface 4 is the aforementioned shadow face (back surface). During lamination, due to uneven heat pressing press between the two surfaces, it is necessary to set the length of the first end electrode segment 3112 slightly larger than that of the second end electrode segment 4112. For example, the length of the first end electrode segment 3112 may be 2 mm-10 mm, while the length of the second end electrode segment 4112 may be 1 mm-9 mm, and a difference in length between the first end electrode segment 3112 and the second end electrode segment 4112 is 2 mm. In this way, during lamination, the first end electrode segment 3112 directly subjected to the press has a larger press bearing area, which reduces the pressure and prevents hidden cracks at contact location.

As an embodiment, the first discontinuous electrode 311 and the second discontinuous electrode 411 are provided to vertically correspond one-to-one with each other, along the thickness direction FH of the solar cell 100. Adopting the same pattern is beneficial for simplifying the design.

As shown in FIGS. 6 to 7, the aforementioned first end electrode segment 3112 and second end electrode segment 4112 correspond to an A end of the first electrode strip 31 and a C end of the second electrode strip 41, adjacent to the first side surface 5 of the solar cell 100.

As an embodiment, the at least two first electrode segments 3111 further include a third end electrode segment 3113 adjacent to the second side surface 6, the at least two second electrode segments 4111 further include a fourth end electrode segment 4113 adjacent to the second side surface 6, and a length of the third end electrode segment 3113 along the length direction F1 is different from a length of the fourth end electrode segment 4113 along the length direction F1.

As shown in FIG. 6-7, the aforementioned third end electrode segment 3113 and fourth end electrode segment 4113 correspond to the other end (a B end) of the first electrode strip 31 and the other end (a D end) of the second electrode strip 41, adjacent to the second side surface 6 of the solar cell 100.

Correspondingly, as an embodiment, the length of the third end electrode segment 3113 along the length direction F1 is greater than the length of the fourth end electrode segment 4113 along the length direction F1, and its technical effect is the same as that of the first end electrode segment 3112 and the second end electrode segment 4112 at the first side 5.

As an embodiment, as shown in FIGS. 5A to 5B and 8A to 8C, at least one first intermediate electrode segment 3114 is further provided between the first end electrode segment 3112 and the third end electrode segment 3113 along the length direction F1; and at least one second intermediate electrode segment 4114 is further provided between the second end electrode segment 4112 and the fourth end electrode segment 4113. This design may fully utilize conductivity of the solder strip, to save electrode materials and ensure firm welding with the solder strip.

As an embodiment, as shown in FIGS. 5C to 5D and 8C to 8D, the first discontinuous electrode 311 of the solar cell 100 may only have the first end electrode segment 3112, or the second discontinuous electrode 411 of the solar cell 100 may only have the second end electrode segment 4112. This design may fully utilize the conductivity of the solder strip to maximize the savings of electrode materials.

As an example, referring to FIGS. 8A to 8D, further embodiments of the solar cell 100 of the present application are shown, wherein the first end electrode segment 3112 and the second end electrode segment 4112 are harpoon structures Y. This design may further reduce stress generated at the end of the electrode strip and on the side of the solar cell 100 when welding the electrode strip with the welding strip.

The harpoon structure here is a forked structure set at the end of the electrode strip. For example, in the case where the electrode strip is the continuous electrode strip, the harpoon structure may be a simple fork of the electrode strip at the end. For example, in the case where the electrode strip is the discontinuous electrode strip, the harpoon structure may be formed as a forked structure of a part of the end electrode segment of the electrode strip, wherein the forked structure may include a fork and a solder pad, and the solder pad may be located between the fork and a remaining part of the end electrode segment. Correspondingly, lengths of the remaining parts on the first surface 3 and the second surface 4 are different, or in other words, lengths of the harpoon structures on the first surface 3 and the second surface 4 are different.

As an embodiment, as shown in FIGS. 8A to 8D, the harpoon structure Y of the present application includes: two branching segments Y1 adjacent to the first side surface 5 and extending along the length direction F1; and a connecting segment Y2 that connects the two branching segments Y1 and extends along the second direction F2.

As an example, the connection segment Y2 here may be the solder pad. A part of each first end electrode segment 3112 or second end electrode segment 4112 may be formed as the forked structure, wherein the forked structure includes the fork and the solder pad located between the fork and the remaining part of each first end electrode segment 3112 or second end electrode segment 4112.

Similarly, the electrode strips of the present application are formed with the aforementioned harpoon structure at the end adjacent to the second side 6 as well, and the continuous electrode strips of the present application have the aforementioned harpoon structure formed at the end adjacent to the side surfaces 5 (6).

As an embodiment, as shown in FIGS. 8A to 8D, the two ends of the first continuous electrode 312 or the second continuous electrode 412 may be formed as the harpoon structure.

As an embodiment, as shown in FIGS. 5B to 5C and 8B to 8C, in the solar cell 100 of the present application, the plurality of first electrode strips 31 include the first continuous electrodes 312, and the plurality of second electrode strips 41 include the second continuous electrodes 412; and each of the first continuous electrodes 312 and each of the second continuous electrodes 412 extend along the length direction F1 from a position adjacent to the first side surface 5 to a position adjacent to the second side surface 6. This design may improve welding strength between the welding strip and the solar cell 100, and as well as increase efficiency of current collection to a certain extent. A disadvantage is that it requires more electrode materials, which may be used in situations where welding reliability is high.

As an embodiment, the first continuous electrode 312 and the second continuous electrode 412 are provided to vertically correspond one-to-one with each other, along the thickness direction FH of the solar cell 100. This design, using the same pattern, is beneficial for simplifying the design.

FIG. 9 is an enlarged schematic diagram of an upper left corner of the solar cell 100 shown in FIGS. 5A to 5D.

As an embodiment, as shown in FIGS. 5A to 5D, 8A to 8D and 9, in the solar cell 100 of the present application, the first surface 3 is further provided with a plurality of first fine grid electrodes 313 extending along the second direction F2 and arranged at intervals along the length direction F1, and a part of the plurality of first fine grid electrodes 313 are crossed and connected with the first end electrode segment 3112; and the second surface 4 is further provided with a plurality of second fine grid electrodes 413 extending along the second direction F2 and arranged at intervals along the length direction F1, and a part of the plurality of second fine grid electrodes 413 are crossed and connected with the second end electrode segment 4112.

In the present application, the first fine grid electrode 313 and the second fine grid electrode 413 are collectively referred to as the fine grid electrodes. The fine grid electrodes are indispensable in solar cells 100 for collecting and initially collecting current. The first electrode strips 31 and the second electrode strips 41 are the main grid electrodes. More often, the width of the fine grid electrode is much thinner than that of the main grid electrode, therefore, the fine grid electrode is not easy to be welded than the main grid electrode.

As an embodiment, as shown in FIGS. 5A to 5D, 8A to 8D and 9, in the solar cell 100 of the present application, widening sections T are provided at positions where the plurality of first fine grid electrodes 313 intersect with the first end electrode segment 3112.

For example, the widening sections T are provided at positions where the plurality of first fine grid electrodes 313 intersect with an extension line of the first end electrode segment 3112.

The second fine grid electrode 413 may have thickened segments T corresponding to the first fine grid electrode 313 as well.

A width of the widening section of the fine grid electrode in the present application may be greater than a width of the solder strip or the width of the main grid electrode.

The present application solves the problem of difficulty in welding the fine grid electrode by setting the widening section of the fine grid electrode, which can prevent poor welding with the welding strip and prevent the welding of the fine grid electrode from breaking.

Additionally, a whole solar cell 100 typically has four chamfers or four chamfered surfaces. The solar cell 100 of the present application may be further cut into a plurality of sub pieces for use. For example, cutting along the aforementioned second direction F2, after cutting, one of the first side surface 5 or the second side surface 6 becomes the cutting surface. Distinguishing between chamfered and cut surfaces facilitates differentiation of solar cells of different specifications.

As an example, referring to FIG. 10, a further embodiment of the solar cell 100 of the present embodiment is shown. In this embodiment, the solar cell 100 is a half cell, an one-third cell, or a quarter cells, etc., in any case, less than one whole cell. In this way, solar cells of different sizes and powers may be obtained by cutting the solar cells 100, so as to meet needs of different places.

As shown in FIG. 10, along the length direction F1, a distance d1 between the endpoint of the first electrode strip 31 adjacent to the first side surface 5 and the first side surface 5 is greater than a distance d2 between the endpoint of the first electrode strip 31 adjacent to the second side surface 6 and the second side surface 6. The first side surface 5 is a chamfered surface with a chamfer, which may be referred to as a non-cutting edge of the solar cell 100, and the second side surface 6 is a cutting surface, which may be referred to as a cutting edge of the solar cell 100.

That is to say, when the solar cell of the present application is the whole cell, the distances d1 and d2 from starting points of the first electrode strip 31 and the second electrode strip 41 to the two corresponding non-cutting edge of the solar cell are equal. The solar cells of this size and power may meet the needs of larger places.

When the solar cell of the present application is a ½, ⅓, or ¼ slice solar cell, the distance d1 from the starting point of the first electrode strip 31 and the second electrode strip 41 to the non-cutting edge of the solar cell is greater than the distance d2 from the starting point of the first electrode strip 31 and the second electrode strip 41 to the cutting edge of the solar cell. The solar cells of this size and power may meet the needs of smaller places.

As another aspect of the present application, referring to FIG. 11, the present application further provides a solar panel including: at least two solar cells 100 as described in FIGS. 5A to 10; and an electrical connector 103, wherein the electrical connector 103 electrically connects the at least two solar cells 100.

The electrical connector 103 here is the aforementioned solder strip.

When two solar cells are interconnected through the welding strip, the first electrode strip on the first surface of the first solar cell is connected to the second electrode strip on the second surface of the second solar cell through the welding strip. A maximum position that the welding strip may start from is at the end of the first electrode strip, which may be inwardly retracted, and a maximum position that the welding strip may end is at the end of the second electrode strip on the second surface of the second solar cell, which may be inwardly retracted as well.

Referring to FIG. 11, as an embodiment of the present application, the electrical connector 103 is electrically connected to the first electrode strip 31 of a first solar cell 101 and the corresponding second electrode strip 41 of a second solar cell 102 adjacent to the first solar cell 101 among the at least two solar cells 100, wherein a distance between an endpoint of the electrical connector 103 adjacent to the first side 5 of the first solar cell 101 and the first side 5, is larger than a distance between the endpoint of the first electrode strip 31 adjacent to the first side 5 and the first side 5, and a distance between an endpoint of the electrical connector 103 adjacent to the second side 6 of the first solar cell 101 and second side 6, is larger than a distance between the endpoint of the first electrode strip 31 adjacent to the second side 6 and the second side 6.

That is to say, a maximum starting position of the solder strip in the present application may be at the end of the electrode strip, which may be inwardly retracted, and a maximum ending position of the solder strip may be at the end of the electrode strip, which may be inwardly retracted. This design may further reduce the stress generated at the end of the electrode strip and on the side of the solar cell 100 when welding the electrode strip with a welding strip.

In conclusion, the solar cell according to the embodiments of the present application has the following advantage:

In the embodiments of the present application, because the projection of the starting point of the front-electrode strip in the first direction and the projection of the starting point of the back-electrode strip in the first direction coincide, when the solar cells are connected by series welding by using a photovoltaic solder strip, the welding stresses generated at the starting point of the front-electrode strip and at the starting point of the back-electrode strip can offset with each other in the positive and negative directions, which prevents hidden cracking at the starting welding spot between the solar cells and the photovoltaic solder strip, thereby effectively increasing the efficiency of the assembling of the solar cells. In addition, the lengths of the two end electrode segments of the electrode strips on the light receiving surface and the back surface are different, which reduces the stress on the front and back surfaces and reduces the pressure on the surface of the solar cell during lamination. The direct pressure bearing surfaces have the longer end grid segments to prevent the hidden cracks.

The embodiments of the present application further provide a solar cell panel, wherein the solar cell panel may particularly be formed by the solar cell stated above.

In the embodiments of the present application, because the projection of the starting point of the front-electrode strip on the solar cell in the first direction and the projection of the starting point of the back-electrode strip in the first direction coincide, when the solar cells are connected by series welding by using a photovoltaic solder strip into the solar cell panel, the welding stresses generated at the starting point of the front-electrode strip and at the starting point of the back-electrode strip can offset with each other in the positive and negative directions, which prevents hidden cracking at the starting welding spot between the solar cells and the photovoltaic solder strip, thereby effectively increasing the efficiency of the assembling of the solar cells.

The embodiments of the present application further provide a screen printing plate, the screen printing plate being used in cooperation with the solar cell stated above. Particularly, the screen printing plate is provided with a printing region, the printing region is provided with a notch, and a shape of the notch matches with a shape of the back electrodes on the solar cell or a shape of the front electrodes on the solar cell.

In practical applications, the shape of the printing region of the screen printing plate may match with the shape of the solar cell, to improve the convenience of the matching between the printing region and the solar cell. Because the printing region is provided with a notch, and the shape of the notch is the same as the shape of the front electrodes/the back electrodes on the solar cell, after the printing region and the solar cell have been adhered, by brush-coating silver slurry, aluminum slurry etc. on the printing region, the silver slurry and the aluminum slurry can flow via the notch onto the solar cell, to form the front electrodes and the back electrodes on the solar cell.

In the present application, because the screen printing plate is provided with a printing region, the printing region is provided with a notch, and the shape of the notch matches with the shape of the back electrodes on the solar cell or the shape of the front electrodes on the solar cell, the front electrodes and the back electrodes of the above-described solar cell can be printed by using the screen printing plate. Because the projection of the starting point of the front-electrode strip on the solar cell in the first direction and the projection of the starting point of the back-electrode strip in the first direction coincide, when the solar cells are connected by series welding by using a photovoltaic solder strip into the solar cell panel, the welding stresses generated at the starting point of the front-electrode strip and at the starting point of the back-electrode strip can offset with each other in the positive and negative directions, which prevents hidden cracking at the starting welding spot between the solar cells and the photovoltaic solder strip, thereby effectively increasing the efficiency of the assembling of the solar cells.

Although the present application has been particularly described and introduced with reference to the preferable embodiments, a person skilled in the art should understand that various variations may be made to the present application in format and details without departing from the spirit and the scope of the present application defined by the appended claims, all of which fall within the protection scope of the present application.

The above-described device embodiments are merely illustrative, wherein the units that are described as separate components may or may not be physically separate, and the components that are displayed as units may or may not be physical units; in other words, they may be located at the same location, and may also be distributed to a plurality of network units. Part or all of the modules may be selected according to the actual demands to realize the purposes of the solutions of the embodiments. A person skilled in the art can understand and implement the technical solutions without paying creative work.

The “one embodiment”, “an embodiment” or “one or more embodiments” as used herein means that particular features, structures or characteristics described with reference to an embodiment are included in at least one embodiment of the present application. Moreover, it should be noted that here an example using the wording “in an embodiment” does not necessarily refer to the same embodiment.

The description provided herein describes many concrete details. However, it can be understood that the embodiments of the present application may be implemented without those concrete details. In some of the embodiments, well-known processes, structures and techniques are not described in detail, so as not to affect the understanding of the description.

In the claims, any reference signs between parentheses should not be construed as limiting the claims. The word “comprise” does not exclude elements or steps that are not listed in the claims. The word “a” or “an” preceding an element does not exclude the existing of a plurality of such elements. The present application may be implemented by means of hardware comprising several different elements and by means of a properly programmed computer. In unit claims that list several devices, some of those devices may be embodied by the same item of hardware. The words first, second, third and so on do not denote any order. Those words may be interpreted as names.

The invention claimed is:

1. A solar cell comprising: a first surface and a second surface arranged opposite each other along a thickness direction of the solar cell; and a first side surface and a second side surface arranged opposite each other along a first direction, and the first surface is a light receiving surface;

wherein a plurality of first electrode strips extending along the first direction and arranged at intervals along a second direction are provided on the first surface, a plurality of second electrode strips extending along the first direction and arranged at intervals along the second direction are provided on the second surface, and the plurality of first electrode strips are provided to vertically correspond one-to-one with the plurality of second electrode strips in the thickness direction of the solar cell; wherein the first direction intersects with the second direction, and the thickness direction of the solar cell is perpendicular to the first direction and the second direction;

projections of endpoints in the first direction, of the first electrode strip and the second electrode strip that are provided to vertically correspond one-to-one with each other, overlaps along the thickness direction of the solar cell;

the plurality of first electrode strips comprise first discontinuous electrodes, and each first discontinuous electrode comprises at least two first electrode segments arranged at intervals along the first direction and extending along the first direction; and the plurality of second electrode strips comprise second discontinuous electrodes, and each second discontinuous electrode comprises at least two second electrode segments arranged at intervals along the first direction and extending along the first direction;

the at least two first electrode segments comprise a first end electrode segment adjacent to the first side surface, the at least two second electrode segments comprise a second end electrode segment adjacent to the first side surface, and a length of the first end electrode segment along the first direction is less than a length of the second end electrode segment along the first direction; and the at least two first electrode segments further comprise a third end electrode segment adjacent to the second side, the at least two second electrode segments further comprise a fourth end electrode segment adjacent to the second side, and a length of the third end electrode segment along the first direction is less than a length of the fourth end electrode segment along the first direction.

2. The solar cell according to claim 1, wherein the first discontinuous electrodes and the second discontinuous electrodes are provided to vertically correspond one-to-one with each other, along the thickness direction of the solar cell.

3. The solar cell according to claim 1, wherein at least one first intermediate electrode segment is provided between the first end electrode segment and the third end electrode segment along the first direction; and at least one second intermediate electrode segment is provided between the second end electrode segment and the fourth end electrode segment.

4. The solar cell according to claim 1, wherein the first end electrode segment and the second end electrode segment are a harpoon structure.

5. The solar cell according to claim 4, wherein the harpoon structure comprises: two branching segments adjacent to the first side surface and extending along the first direction; and a connecting segment that connects the two branching segments and extends along the second direction.

6. The solar cell according to claim 1, wherein the plurality of first electrode strips comprise first continuous electrodes, and the plurality of second electrode strips comprise second continuous electrodes; and each of the first continuous electrodes and the second continuous electrodes extends along the first direction from a position adjacent to the first side surface to a position adjacent to the second side surface.

7. The solar cell according to claim 6, wherein the first continuous electrodes and the second continuous electrodes are provided to vertically correspond one-to-one with each other, along the thickness direction of the solar cell.

8. The solar cell according to claim 1, wherein the first surface is further provided with a plurality of first fine grid electrodes extending along the second direction and arranged at intervals along the first direction, and a part of the plurality of first fine grid electrodes are crossed and connected with the first end electrode segment; and the second surface is further provided with a plurality of second fine grid electrodes extending along the second direction and arranged at intervals along the first direction, and a part of the plurality of second fine grid electrodes are crossed and connected with the second end electrode segment.

9. The solar cell according to claim 8, wherein widening sections are provided at positions where the plurality of first fine grid electrodes intersect with the first end electrode segment.

10. The solar cell according to claim 8, wherein widening sections are provided at positions where the plurality of first fine grid electrodes intersect with an extension line of the first end electrode segment.

11. The solar cell according to claim 1, wherein, along the first direction, a distance between the endpoint of the first electrode strip adjacent to the first side surface and the first side surface, is greater than a distance between the endpoint of the first electrode strip adjacent to the second side surface and the second side surface, the first side surface is a chamfered surface with chamfers, and the second side surface is a cutting surface.

12. A solar panel comprising: at least two solar cells according to claim 1; and an electrical connector, wherein the electrical connector electrically connects the at least two solar cells.

13. The solar panel according to claim 12, wherein the electrical connector is electrically connected to the first electrode strip of a first solar cell and the corresponding second electrode strip of a second solar cell adjacent to the first solar cell among the at least two solar cells, wherein a distance between an endpoint of the electrical connector adjacent to the first side of the first solar cell and the first side, is larger than a distance between the endpoint of the first electrode strip adjacent to the first side and the first side, and a distance between an endpoint of the electrical connector adjacent to the second side of the first solar cell and second side, is larger than a distance between the endpoint of the first electrode strip adjacent to the second side and the second side.

* * * * *